United States Patent
Chiang et al.

(10) Patent No.: US 10,712,770 B1
(45) Date of Patent: Jul. 14, 2020

(54) CLOCK PHASE ALIGNER FOR HIGH SPEED DATA SERIALIZERS

(71) Applicant: Xilinx, Inc., San Jose, CA (US)

(72) Inventors: Ping-Chuan Chiang, Yilan (TW); Kee Hian Tan, Singapore (SG); Arianne B. Roldan, Los Gatos, CA (US); Nakul Narang, Singapore (SG); Yipeng Wang, Singapore (SG); Yohan Frans, Palo Alto, CA (US); Kun-Yung Chang, Los Altos Hills, CA (US)

(73) Assignee: XILINX, INC., San Jose, CA (US)

( * ) Notice: Subject to any disclaimer, the term of this patent is extended or adjusted under 35 U.S.C. 154(b) by 122 days.

(21) Appl. No.: 16/042,785

(22) Filed: Jul. 23, 2018

(51) Int. Cl.
| | |
|---|---|
| *G06F 1/12* | (2006.01) |
| *G06F 1/10* | (2006.01) |
| *H03K 19/018* | (2006.01) |
| *H04J 3/06* | (2006.01) |
| *G06F 13/16* | (2006.01) |
| *G11C 7/22* | (2006.01) |

(52) U.S. Cl.
CPC ............ *G06F 1/10* (2013.01); *G06F 1/12* (2013.01); *G06F 13/1689* (2013.01); *H03K 19/01837* (2013.01); *H04J 3/0685* (2013.01); *G11C 7/22* (2013.01)

(58) Field of Classification Search
CPC .......... G06F 1/10; G06F 1/12; G06F 13/1689; H04J 3/0685
USPC ...................................................... 713/401
See application file for complete search history.

(56) References Cited

U.S. PATENT DOCUMENTS

| | | | |
|---|---|---|---|
| 6,600,355 B1 * | 7/2003 | Nguyen ................... G06F 1/08 327/149 |
| 7,346,794 B1 | 3/2008 | Davidson et al. | |
| 7,426,247 B2 | 9/2008 | Yang et al. | |
| 7,478,030 B1 * | 1/2009 | Ballagh ............... G06F 17/5027 703/19 |
| 8,650,429 B1 * | 2/2014 | Starr ................ H03K 19/01837 713/400 |
| 9,148,192 B1 * | 9/2015 | Wong ....................... H04L 25/14 |
| 2002/0196061 A1 * | 12/2002 | Atyunin ................. H03K 5/135 327/158 |
| 2004/0221144 A1 * | 11/2004 | Chiao ...................... G06F 1/10 713/1 |

(Continued)

*Primary Examiner* — Volvick Derose
(74) *Attorney, Agent, or Firm* — Craige Thompson; Thompson Patent Law

(57) ABSTRACT

Apparatus and associated methods relate to a high-speed data serializer with a clock calibration module including a main multiplexer (MMUX), a replicated multiplexer (RMUX), a duty cycle calibration module (DCC), and a set of adjustable delay lines (ADLs), the ADLs generating calibrated clocks from a set of system clocks, the DCC sensing duty cycle and phase of the calibrated clocks. In an illustrative example, the DCC may generate error signals indicative of deviation from an expected duty cycle using low-pass filters. The error signals control the ADLs, which may provide continuous corrections to the calibrated clocks, for example. The MMUX and RMUX may receive the calibrated clocks, the RMUX generating a duty cycle indicating clock-to-data phasing, the MMUX providing live data multiplexing, for example. Various multiplexer calibration schemes may reduce jitter, which may facilitate increased data rates associated with high-speed serial data streams.

20 Claims, 12 Drawing Sheets

(56) References Cited

U.S. PATENT DOCUMENTS

| | | | |
|---|---|---|---|
| 2008/0036509 A1* | 2/2008 | Jang | H03K 5/135 327/141 |
| 2014/0198810 A1* | 7/2014 | Jones | H03L 7/0814 370/507 |
| 2019/0007036 A1* | 1/2019 | Fu | H03K 5/1565 |
| 2019/0080734 A1* | 3/2019 | Tsuji | G11C 7/222 |

* cited by examiner

CLOCK PHASE ALIGNER FOR HIGH SPEED DATA SERIALIZERS

TECHNICAL FIELD

Various embodiments relate generally to high-speed data serializers.

BACKGROUND

Modern networks are responsible for interconnecting computing devices operable to exchange data. Data may be exchanged from circuit board to circuit board along a common backplane, for example, in a computer or server. In some implementations, data may be exchanged over long distances, for example, from a travel agent's computer to an airline server on a cloud network. Modern networks may employ a number of mediums including physical wires, radio frequency (RF) channels or fiber optics. Data exchanged between computing devices may include data packets including multiple bits. In some network implementations, the bits may be transmitted and received simultaneously. Such communication may be known as parallel and may include multiple parallel connections known as a bus. In some implementations, data may be transmitted one bit at a time, or serially.

Given a common signal frequency, serial data communication is slower than parallel communication since with serial communication each bit is transmitted individually, and in parallel communication a group of bits are communicated simultaneously in sequential time slices. However, as communication signal frequencies increase (and time slices decrease), bit transit times may become a significant factor causing challenges for simultaneous data arrival times in parallel data implementations. Since serial transmission implementations transmit data one bit at a time, there is inherently no simultaneous data. This aspect of serial transmission may allow data to be transmitted at higher signaling frequencies. Accordingly, network designers may trade off various advantages and disadvantages of parallel versus serial data transmission for specific applications.

SUMMARY

Apparatus and associated methods relate to a high-speed data serializer with a clock calibration module including a main multiplexer (MMUX), a replicated multiplexer (RMUX), a duty cycle calibration module (DCC), and a set of adjustable delay lines (ADLs), the ADLs generating calibrated clocks from a set of system clocks, the DCC sensing duty cycle and phase of the calibrated clocks. In an illustrative example, the DCC may generate error signals indicative of deviation from an expected duty cycle using low-pass filters. The error signals control the ADLs, which may provide continuous corrections to the calibrated clocks, for example. The MMUX and RMUX may receive the calibrated clocks, the RMUX generating a duty cycle indicating clock-to-data phasing, the MMUX providing live data multiplexing, for example. Various multiplexer calibration schemes may reduce jitter, which may facilitate increased data rates associated with high-speed serial data streams.

Various embodiments may achieve one or more advantages. For example, some embodiments may increase the transmission distance between high-speed SERDES transceivers, which may allow users increased flexibility in locating their computing devices. In some examples, clock jitter may be reduced by about 65% which may advantageously lower the bit error rates (BER) in high-speed serial connections. Lower jitter specifications may provide increased noise margins and/or increased jitter budgets, giving additional design latitudes for computer system architects. Various implementations may consume lower power, which may allow designers to afford higher transmission power, further increasing transmission distance and/or design margins. Due to the real-time continuous clock tuning, various examples may compensate for voltage and temperature variations.

In an exemplary aspect, a multiplexer-clock phase-alignment system for an integrated circuit may include a replica multiplexer (RMUX) configured to generate a replica serial data output signal (RDout) in response to a multiphase RMUX control input. The system may include a duty cycle calibration (DCC) processing circuit configured to receive the replica serial data output signal RDout, and the multiphase RMUX control input, and may be configured to generate a delay control signal in response to sensing duty cycle errors in the multiphase RMUX control input. The system may include an adjustable delay line circuit (ADL) configured to update the multiphase RMUX control input by selectively delaying component signals of the multiphase RMUX control input in response to the delay control signal. The system may include a main multiplexer (MMUX) fabricated on a common substrate with the RMUX and may be configured to replicate the multiplexer operation of the RMUX in response to the multiphase RMUX control input.

In various embodiments of the system, the multiphase RMUX control input may include in-phase clock signals (CKI) and quadrature clock signals (CKQ). The CKI signals may include CK0' and CK180', and the CKQ signals includes CK90' and CK270'. The adjustable delay line circuit (ADL) may include a first adjustable delay line adapted to delay a system in-phase clock signal (CK0,180) in response to the first delay control signal, to generate the CKI signals. The adjustable delay line circuit (ADL) may include a second adjustable delay line adapted to delay a system quadrature clock signal (CK90,270) in response to the second delay control signal, to generate the CKQ signals. The sensed duty cycle errors in the multiphase RMUX control input may include deviations of the CKQ from a 50% duty cycle. The sensed duty cycle errors in the multiphase RMUX control input may include deviations of the CKI signals from a 50% duty cycle. The RMUX may be configured to form RDout as a substantially 50% duty cycle square wave clock signal at a frequency that may be double a frequency of either one of the CKI signals and CKQ.

In various embodiments of the system, in response to a variance of the duty cycle of RDout with respect to a 50% duty cycle, the DCC may be further configured to inject an offset voltage into at least one of a first delay control signal and a second delay control signal of the delay control signal. The injected offset voltage may be operable to adjust at least one of two or more of voltage-controlled delay lines of the adjustable delay line circuit (ADL). The at least one of two or more voltage-controlled delay lines of the adjustable delay line circuit (ADL) may include a first adjustable delay line adapted to modulate the duty cycle of CKI in response to the first delay control signal, and a second adjustable delay line may include a delay line adapted to modulate the duty cycle of CKQ in response to the second delay control signal. The first and second adjustable delay lines may be configured to modulate a phase relationship between the CKI signals and the CKQ signals by modulating a timing between a rising edge or a falling edge of CKI relative to a rising edge or a falling edge of CKQ.

In various embodiments of the system, the duty cycle calibration (DCC) processing circuit may be configured to generate the delay control signal in response to the replica serial data output signal RDout by sensing phase shift error in alignment between the CKI signals and the CKQ signals. The duty cycle calibration (DCC) processing circuit may include at least one low pass filter adapted to sense duty cycle error in the multiphase RMUX control input.

In an exemplary aspect, a method to align multiple-phase clocks for a multiplexer on an integrated circuit may include generating, with a replica multiplexer (RMUX), a replica serial data output signal (RDout) in response to a multiphase RMUX control input. The method may include receiving, with a duty cycle calibration (DCC) processing circuit, the replica serial data output signal RDout, and the multiphase RMUX control input. The method may include generating, with the duty cycle calibration (DCC) processing circuit, a delay control signal in response to sensing duty cycle errors in the multiphase RMUX control input. The method may include updating, with an adjustable delay line circuit (ADL), the multiphase RMUX control input by selectively delaying component signals of the multiphase RMUX control input in response to the delay control signal. The method may include replicating, with a main multiplexer (MMUX) fabricated on a common substrate with the RMUX, the multiplexer operation of the RMUX in response to the multiphase RMUX control input.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

To aid understanding, this document is organized as follows. First, an exemplary use case is briefly introduced with reference to FIG. 1. Second, with reference to FIG. 2 an exemplary multiplexer circuit of the type employed herein, is presented. Next with reference to FIG. 3, the multiplexer is replicated and employed in an exemplary phase adjustment module, the module generating a set of clocks (based on the in-phase and quadrature input clocks) adjusted for duty cycle and phase. Next with reference to FIG. 4, exemplary diagrams are presented to aid in the understanding of the replicated multiplexer (RMUX) described in FIG. 2. Next with reference to FIG. 5 the functionality of an exemplary sensing module is described. FIGS. 6A and 6B present the sequential and recursive clock adjustment functions in an exemplary duty cycle and phase adjustment module. Next, with reference to FIGS. 7 and 8, further explanatory discussion and experimental data is presented to explain improvements in clock jitter. Next, FIGS. 9A and 9B, an exemplary programmable integrated circuit (IC) on which the disclosed circuits and processes may be implemented, is described. Finally, with reference to FIG. 10, an exemplary clock phase alignment method is presented.

Throughout this application, the convention $CK_x$ may be used to define a clock signal, the subscript x indicating the relative phase delays in degrees. Further, $CK_{0,180}$ may be used as shorthand to define a pair of clock signals $CK_0$, and $CK_{180}$. $CK_{90,270}$ may be used as shorthand for the pair of clock signals $CK_{90}$ and $CK_{270}$. The term in-phase clocks may be used to define a differential pair of clocks $CK_{0,180}$. The term quadrature clocks may be used to define a differential pair of clocks $CK_{90,180}$. The term system clocks may be used to define the in-phase and quadrature clocks combination ($CK_{0,180,90,270}$). In various examples, the system clocks may be generated external to the described embodiments. In addition, the series switches depicted throughout the figures may be controlled by the logic signals coupled to the switch symbols. Unless specified otherwise, when the control logic is high, the switch is defined as closed. Accordingly, when the control logic is low, the switch is defined as open.

Throughout this application, the term "replica" and its conjugated forms may be defined as copied with the same circuit layout pattern(s) on a common substrate. In this application, a main multiplexer (MMUX) having a pre-defined circuit layout pattern may be replicated forming a replica multiplexer (RMUX) for the purpose of replicating the specific functions and timing (e.g., clock delays, signal delays, rise times, fall times) of the MMUX. Further, the RMUX may replicate or substantially emulate the MMUX timing over process, voltage and temperature.

Figure 1:
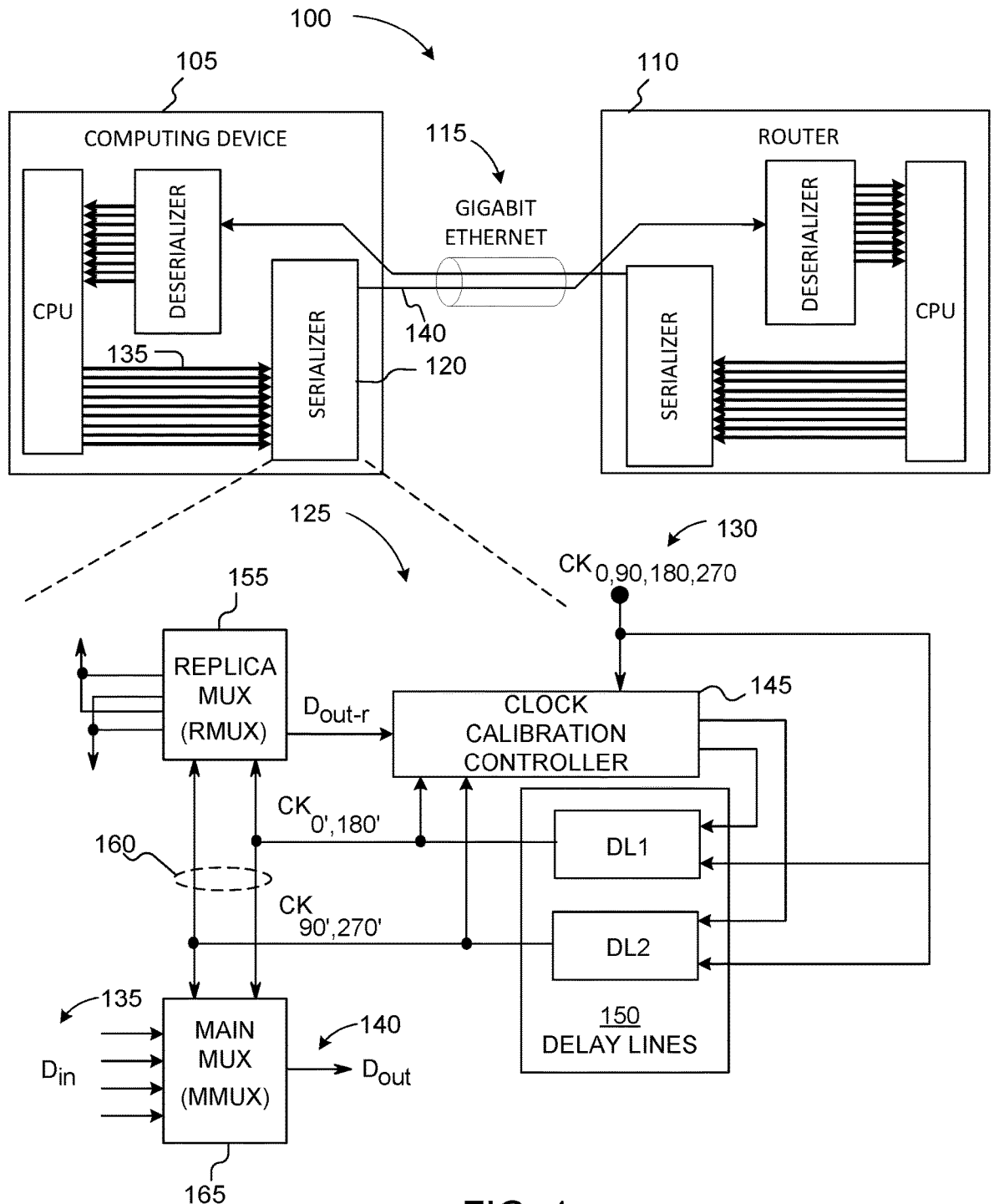
FIG. 1 depicts an exemplary multiplexer clock phase calibration module implemented within a serializer integrated circuit (IC) or module, the multiplexer clock phase calibration module increasing the reliability and noise immunity of a high-speed serializer/deserializer (SERDES) application.

FIG. 1 depicts an exemplary multiplexer clock calibration module implemented within a serializer module, the multiplexer clock calibration module increasing the reliability and noise immunity of a high-speed serializer/deserializer (SERDES) application. A computer communication application 100 includes a computing device 105 (e.g., personal computer) in communication with a router 110 over a gigabit ethernet network 115. The computing device 105 provides high-speed serial data 140 from a serializer module 120.

In the depicted example, the serializer module 120 includes a multiplexer clock calibration module 125. The multiplexer clock calibration module 125 receives a set of system clocks 130 (e.g., multiplexer clocks) and input data 135. The multiplexer clock calibration module 125 sends out serial data 140 in response to the input data 135 clocked by the set of system clocks 130 through the multiplexer clock calibration module 125.

The multiplexer clock calibration module 125 includes a clock calibration controller 145. The clock calibration controller 145 receives the set of system clocks 130, detects their deviation from an expected duty cycle, and provides an error correction signal to a delay line module 150. The clock calibration controller 145 also receives a $D_{out-r}$ signal from a replica mux 155, the signal indicative of phasing error between the set of system clocks 130 (e.g., in-phase clock set $CK_{0,180}$, quadrature clock set $CK_{90,270}$). The clock calibration controller 145 provides an error correction signal to the delay line module 150 in response to a deviation from an expected phase shift between the in-phase clock set $CK_{0,180}$ and the quadrature clock set $CK_{90,270}$.

A corrected set of clocks 160 ($CK_{0',180'}$, $CK_{90',270'}$) from the delay line module 150 are sent to the replica mux 155 for subsequent deviation determination. The multiplexer clock calibration module 125 provides iterative deviation detection and clock adjustments. The replica mux 155 may be fabricated as a substantial replica of a main mux 165. The main mux 165 receives the same corrected set of clocks 160 as the replica mux 155. The replica mux 155 replicates the timing parameters of the main mux 165. Accordingly, the main mux 165 serializes the input data 135 with the corrected set of clocks 160, thereby providing a low bit error rate. The multiplexer clock calibration module 125 may be implemented, for example, within a multi-gigabit transceiver (MGT) on a field programmable gate array (FPGA).

Figure 2:
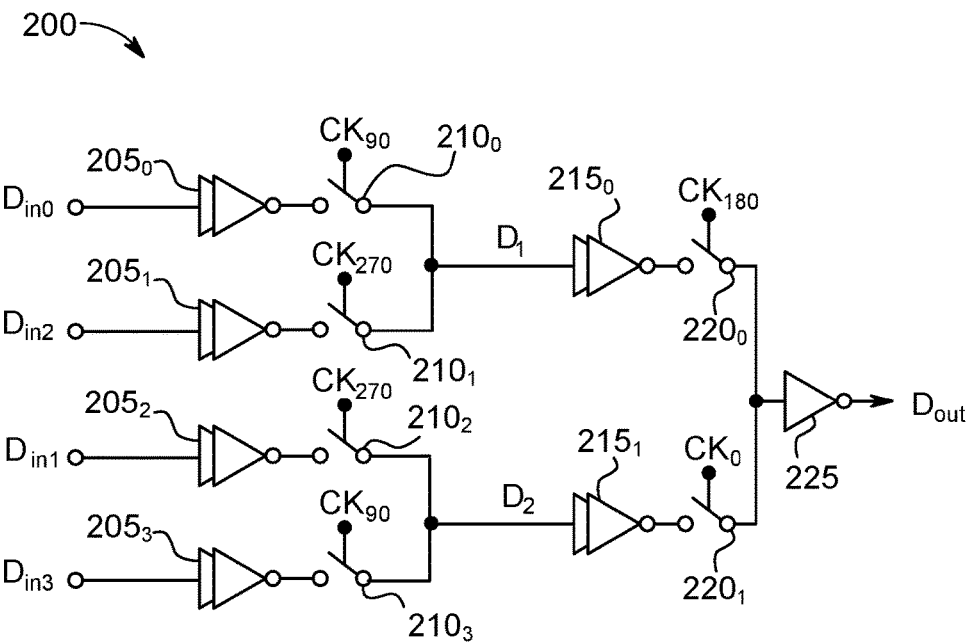
FIG. 2 depicts an exemplary 4-to-1 multiplexer implementation.
Figure 2:
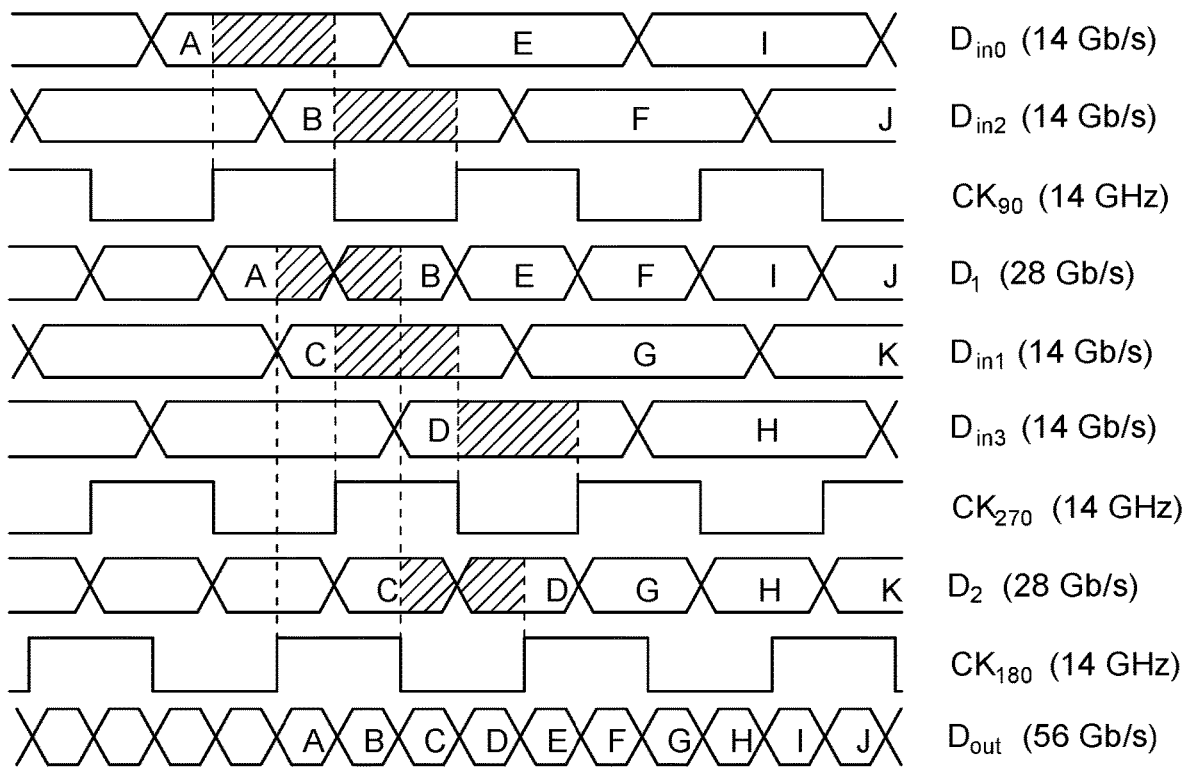

FIG. 2 depicts an exemplary 4-to-1 multiplexer implementation. A 4-to-1 data multiplexer 200 includes input buffers $205_0$, $205_1$, $205_2$, $205_3$ (hereinafter collectively referred to as "input buffers 205"). The input buffers 205 receive parallel input data $D_{in0}$, $D_{in2}$, $D_{in1}$ and $D_{in3}$. The input buffers 205 are coupled to series switches $210_0$, $210_1$, $210_2$, and $210_3$ (hereinafter collectively referred to as "series switches 210"). Series switches $210_0$ and $210_1$ are controlled by quadrature clocks $CK_{90}$ and $CK_{270}$, respectively and control the data $D_1$. Series switches $210_2$ and $210_3$ are controlled by quadrature clocks $CK_{270}$ and $CK_{90}$, respectively and control the data $D_2$.

Data $D_1$ and data $D_2$ are coupled to intermediate buffers $215_0$ and $215_1$, respectively (hereinafter collectively referred to as "intermediate buffers 215"). The intermediate buffers 215 are coupled to series switches $220_0$, $220_1$ (hereinafter collectively referred to as "series switches 220"). Series switches $220_0$ and $220_1$ are controlled by in-phase clocks $CK_{180}$ and $CK_0$, respectively and control the data to a final buffer 225. The final buffer 225 drives output data $D_{out}$.

The 4-to-1 data multiplexer 200 may pass input data $D_{in0}$ to output data $D_{out}$ when $CK_{90}$ and $CK_{180}$ are active (e.g., logic high) and $CK_{270}$ and $CK_{90}$ are inactive (e.g., logic low). The 4-to-1 data multiplexer 200 may pass input data $D_{in1}$ to output data $D_{out}$ when $CK_{270}$ and $CK_{90}$ are active (e.g., logic high) and $CK_{90}$ and $CK_{180}$ are inactive (e.g., logic low). The 4-to-1 data multiplexer 200 may pass input data $D_{in2}$ to output data $D_{out}$ when $CK_{270}$ and $CK_{180}$ are active (e.g., logic high) and $CK_{90}$ and $CK_0$ are inactive (e.g., logic low). The 4-to-1 data multiplexer 200 may pass input data $D_{in3}$ to output data $D_{out}$ when $CK_{90}$ and $CK_{90}$ are active (e.g., logic high) and $CK_{270}$ and $CK_{180}$ are inactive (e.g., logic low).

The 4-to-1 data multiplexer 200 may be a compact MUX structure. The 4-to-1 data multiplexer 200 employs quarter-rate clocks (e.g., $CK_{0,90,180,270}$) to consume natively low power. The final stage switches (series switches 220) pass two consecutive bits when $CK_{90}$ or $CK_{180}$ is high. Accordingly, the clocking power and the MUX output jitter both are substantially low. Simulation may be performed to demonstrate that the output jitter may be about 359 fs with about 2.4 mW power consumption, including the power consumption of a clock buffer (not shown).

Since the final stage switches (series switches 220) of this 4-to-1 data multiplexer 200 pass two bits to the output $D_{out}$ when $CK_{90}$ or $CK_{180}$ is high, the internal data $D_1$ and $D_2$ are directly affected by the alignment of clock phases of $CK_{90}$ or $CK_{180}$. If $CK_{90}$ or $CK_{180}$ is not aligned with the center of the data bits on $D_1$ and $D_2$, the bit width variation may appear at the output node $D_{out}$, leading to larger output data jitter.

In an illustrative example, an array of data signals may include data signals $D_{in0}$, $D_{in1}$ $D_{in2}$ and $D_{in3}$. $D_{in0}$ may be configured to connect to form a first internal node in response to $CK_{90}$. $D_{in2}$ may be configured to connect to the first internal node in response to $CK_{270}$. $D_{in1}$ may be configured to connect to form a second internal node in response to $CK_{270}$. $D_{in3}$ may be configured to connect to the second internal node in response to $CK_{90}$. The first internal node may be configured to connect to form $D_{out}$ in response to $CK_{180}$ and the second internal node may be configured to connect to form $D_{out}$ in response to $CK_0$.

Figure 3:
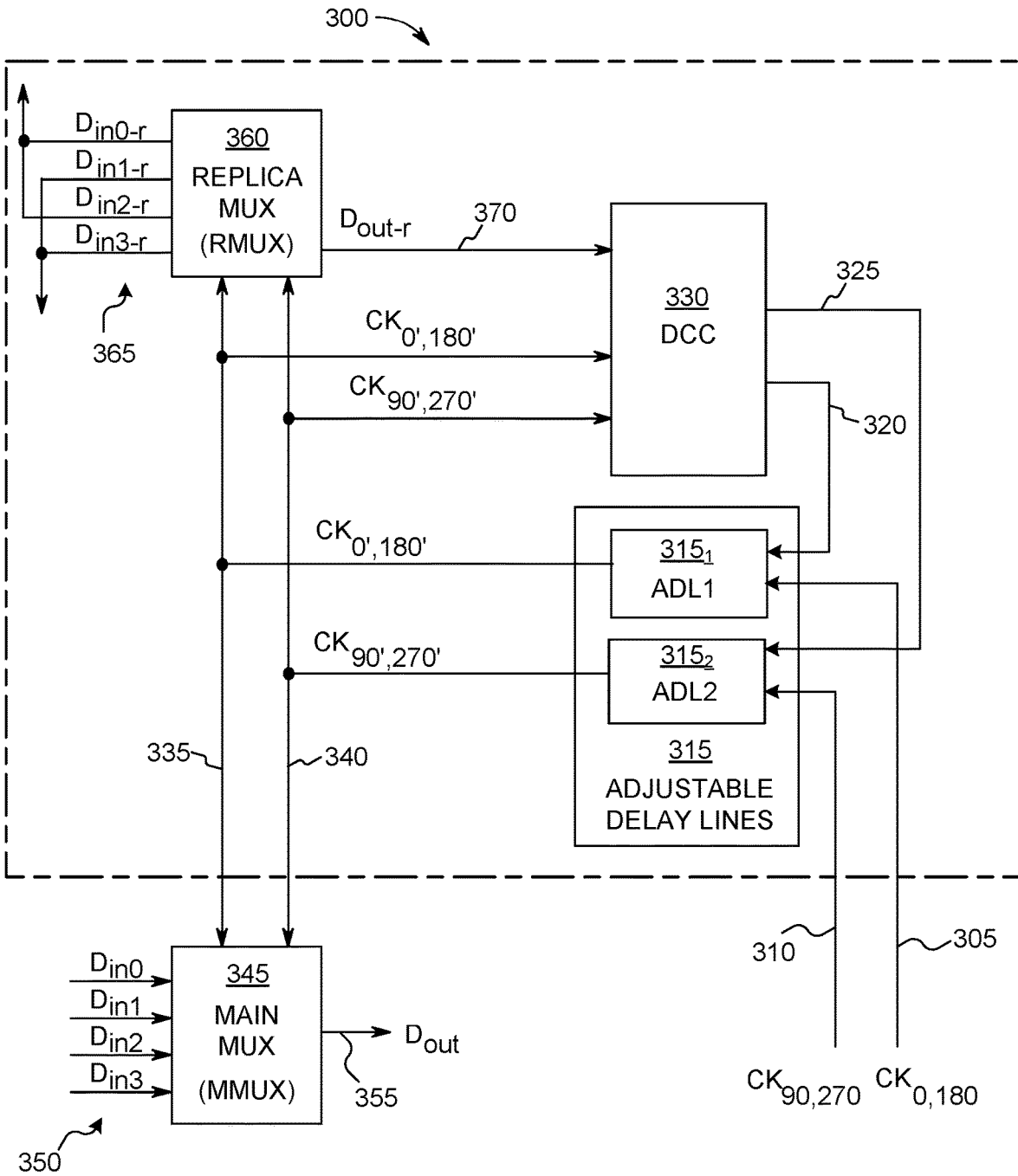
FIG. 3 depicts a multiplexer combined with an exemplary clock phase alignment module.

FIG. 3 depicts a multiplexer combined with an exemplary clock phase alignment module. A clock phase alignment module 300 receives a set of in-phase clocks ($CK_{0,180}$) 305 and a set of quadrature clocks ($CK_{90,270}$) 310. An adjustable delay line (ADL1) $315_1$ receives the in-phase clocks ($CK_{0,180}$) 305 and a correction signal 320. An adjustable delay line (ADL2) $315_2$ receives the quadrature clocks ($CK_{90,270}$) 310 and a correction signal 325. (The adjustable delay lines $315_1$ and $315_2$ may be collectively referred to as "adjustable delay lines 315.") The adjustable delay lines 315 may each include one or more delay lines, each delay line 315 operable to generate a delayed input signal. A DCC 330 generates the correction signal 320 in response to a deviation from 50% duty of a set of corrected in-phase clocks ($CK_{0',180'}$) 335. The DCC 330 generates the correction signal 325 in response to a deviation from 50% duty of a set of corrected quadrature clocks ($CK_{90',270'}$) 340. The adjustable delay line (ADL1) $315_1$ delays the leading and/or trailing edges of the in-phase clocks ($CK_{0,180}$) 305 and generates the set of corrected in-phase clocks ($CK_{0',180'}$) 335 in response to the correction signal 320. The adjustable delay line (ADL2) $315_2$ delays the leading and/or trailing edges of the quadrature clocks ($CK_{90,270}$) 310 and generates the set of corrected quadrature clocks ($CK_{90',270'}$) 340 in response to the correction signal 325. Accordingly, the corrected in-phase clocks ($CK_{0',180'}$) 335 and the corrected quadrature clocks ($CK_{90',270'}$) 340 may possess duty cycles of substantially 50%.

The adjustable delay lines 315 provide the corrected in-phase clocks ($CK_{0',180'}$) 335 and the corrected quadrature clocks ($CK_{90',270'}$) 340 to a main multiplexer (MMUX) 345. In some examples, the MMUX 345 receives the clocks 335 and 340 through a multiphase control input. The MMUX 345 serializes a parallel input data bus ($D_{in0}$, $D_{in1}$, $D_{in2}$, $D_{in3}$) 350 into a data stream ($D_{out}$) 355.

A replica multiplexer (RMUX) 360 also receives the corrected in-phase clocks ($CK_{0',180'}$) 335 and the corrected quadrature clocks ($CK_{90',270'}$) 340. In some examples, the RMUX 360 receives the clocks 335 and 340 through a multiphase control input. The RMUX 360 may be fabricated as a substantial replica of the MMUX 345, may be fabricated on a common substrate with the main multiplexer 345, and may replicate the main multiplexer 345 configuration, functions and timing properties. Accordingly, the timing associated with the data bits within the data stream ($D_{out}$) 355 may be replicas of the timing associated with the data bits within a data stream ($D_{out-r}$) 370 of the RMUX 360.

The RMUX 360 receives an input data bus ($D_{in0-r}$, $D_{in1-r}$, $D_{in2-r}$, $D_{in3-r}$) 365. The input data bus ($D_{in0-r}$, $D_{in1-r}$, $D_{in2-r}$, $D_{in3-r}$) 365 is configured to produce a data stream ($D_{out-r}$) 370 with alternating data bit logic. The data stream ($D_{out-r}$) 370 is clocked through the RMUX 360, which may be fabricated as a substantial replica of the MMUX 345. Since the RMUX 360 is fabricated on the same substrate as the replica of the MMUX 345, the configuration, functions and timing properties of the RMUX 360 may be replicas of the MMUX 345. Further, the clock-to-data phasing on the RMUX 360 may be replicas of the clock-to-data phasing on the MMUX 345. In an illustrative example, if the edges of the corrected in-phase clocks ($CK_{0',180'}$) 335 are centered about the data bits in the main serial data stream ($D_{out}$) 355, then the edges of the corrected in-phase clocks ($CK_{0',180'}$) 335 are centered about the data bits in the replica serial data stream ($D_{out-r}$) 370.

Since the data bits on the input of the RMUX 360 are configured with alternating logic, the data stream ($D_{out-r}$) 370 may generate alternating bit logic. Further, the duty cycle of the data stream ($D_{out-r}$) 370 from the RMUX 360 may be indicative of the centering of the corrected in-phase clocks ($CK_{0',180'}$) 335 with the corrected quadrature clocks ($CK_{90',270'}$) 340. The data stream ($D_{out-r}$) 370 from the RMUX 360 is sent to the DCC 330. The DCC 330 generates the correction signals 320 and/or 325, in response to the deviation from 50% duty cycle of the data stream ($D_{out-r}$) 370. Since the deviation could involve a correction delay of the in-phase clock or a correction delay of the quadrature clock, the DCC may generate the correction signals 320 and/or 325. In response to the correction signal 320, the adjustable delay line $315_1$ may adjust the phase of the corrected in-phase clocks ($CK_{0',180'}$) 335. In response to the correction signal 325, the adjustable delay line $315_2$ may further adjust the phase of the corrected quadrature clocks ($CK_{90',270'}$) 340. The corrected phase may place the clocking edges substantially centered within each data bit of the data stream ($D_{out}$) 355.

In various implementations, the correction signals 320 and 325 may each be a set of data buses. For example, the correction signals 320 and 325 may each include a bus containing a rising edge delay value and a falling edge delay value. Accordingly, the adjustable delay lines 315 may adjust the phases of the clocks 335, 340 by changing the delay of rising edges and falling edges by the same amount. Further, the adjustable delay lines 315 may adjust the duty cycle of the corrected in-phase clocks ($CK_{0',180'}$) 335 and the corrected quadrature clocks ($CK_{90',270'}$) 340 by changing the delay of the rising and falling edges.

In various examples, the clock phase alignment module 300 may produce continuously duty-balanced and phase-aligned in-phase and quadrature clocks. The duty-balanced and phase-aligned clocks may advantageously reduce jitter in various serializer-deserializer (SERDES) applications. The implementation depicted in FIG. 3 may be a clock phase calibrated multiplexer, for example.

Figure 4A:
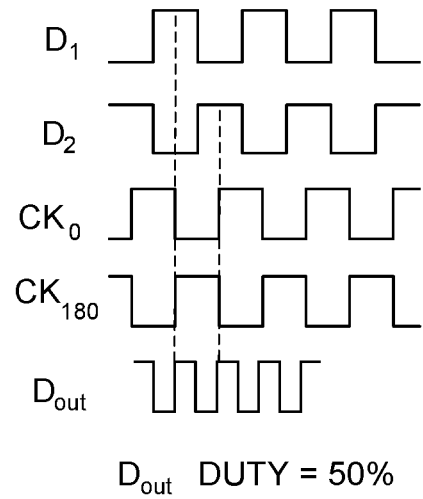
FIGS. 4A, 4B and 4C depict output data streams from an exemplary multiplexer circuit with variable duty cycle in response to variable clock phase.
Figure 4B:
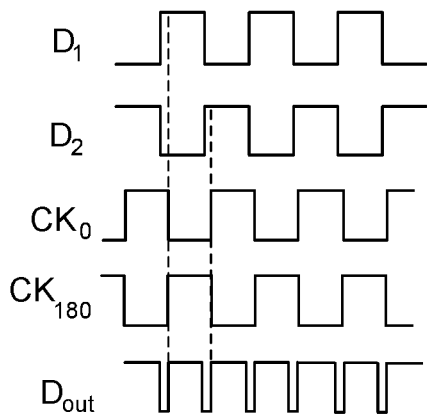
Figure 4C:
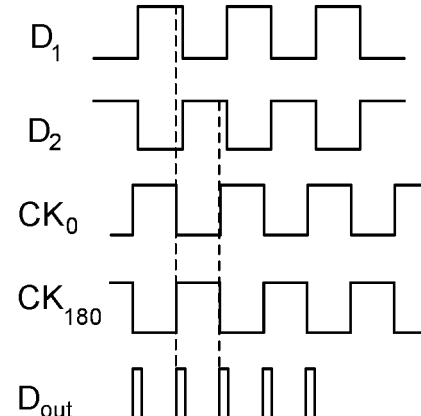

FIGS. 4A, 4B and 4C depict output data streams from an exemplary multiplexer circuit with variable output duty cycle in response to variable clock phase. An in-phase clock ($CK_0$) and an inverted in-phase clock ($CK_{180}$) multiplex a data signal $D_1$ and a data signal $D_2$ through the multiplexer 200 depicted in FIG. 2. The multiplexer 200 may represent the logic configuration of the MMUX 345 and the RMUX 360. On multiplexer 200 in FIG. 3, when the data inputs $D_{in0}$ and $D_{in1}$ are tied high, and $D_{in1}$ and $D_{in3}$ are tied low, a data stream may be produced on $D_1$ and $D_2$ with data that transitions to an opposite logic level on every transition of the quadrature clocks $CK_{90}$ and $CK_{270}$.

The exemplary waveforms of FIGS. 4A, 4B and 4C may be generated from the multiplexer 200 with data inputs $D_{in0}$ and $D_{in1}$ tied high, and $D_{in1}$ and $D_{in3}$ tied low. In operation, with reference to FIGS. 4A, 4B and 4C, when in-phase clock $CK_0$ is low, data signal $D_1$ is passed to $D_{out}$ in real-time. Further, when inverted in-phase clock $CK_{180}$ is high, data signal $D_2$ is passed to $D_{out}$ in real time. Since the data signals $D_1$ and $D_2$ pass through series switches 220, actual data signals, including the data transitions, are selectively passed from $D_1$ to $D_{out}$ or from $D_2$ to $D_{out}$.

Accordingly, the $D_{out}$ signal produces a duty cycle in response to the nearness of the edges of the in-phase clocks $CK_{90}$ and $CK_{180}$ to the center of the transitions on $D_1$ and $D_2$. The closer the clocking edges of the in-phase clock $CK_{90}$ and $CK_{180}$ edges are to the mid-point between the transitions of the data signals $D_1$ and $D_2$, the closer the duty cycle of $D_{out}$ becomes to 50%. The duty cycle of $D_{out}$ is indicative of the centering of the clock(s) with the data boundaries in the data signals $D_1$ and $D_2$.

As depicted in FIG. 4A, the in-phase clock $CK_{90}$ is centered about the transitions on $D_1$ and $D_2$. The transitions on $D_1$ and $D_2$ may represent the transitions of the quadrature clock (FIG. 2, $CK_{90}$ and $CK_{270}$). Various clock phase alignment module embodiments may be operable to regulate the phase of the in-phase clocks ($CK_0$, and $CK_{180}$) to be substantially centered between the transitions of the quadrature clock ($CK_{90}$, and $CK_{270}$) such that $D_{out}$ produces a duty cycle of substantially 50%.

As depicted in FIG. 4B, the in-phase clock $CK_{90}$ is early with respect to the mid-point of the transitions on data signals $D_1$ and $D_2$. In this example, $D_{out}$ produces a duty cycle of greater than 50% in response to the in-phase clock arriving early.

As depicted in FIG. 4C, the in-phase clock $CK_{90}$ is late with respect to the mid-point of the transitions on data signals $D_1$ and $D_2$. In this example, $D_{out}$ produces a duty cycle of less than 50% in response to the in-phase clock arriving late.

In some examples, the data inputs may be configured opposite as described in FIGS. 4A-4C, such that $D_{in0}$ and $D_{in1}$ are logic low, and $D_{in1}$ and $D_{in3}$ are logic high. In such examples, the data signals $D_1$ and $D_2$ may be inverted from those described in FIGS. 4A-4C. In the case of the in-phase clock coming early, as depicted in FIG. 4B, the duty cycle of $D_{out}$ may be less than 50%. In the cases where the in-phase clock coming late, as depicted in FIG. 4C, the duty cycle of $D_{out}$ may be greater than 50%. The corresponding downstream circuits may be implemented with reverse logic to achieve the same overall results.

FIGS. 4A, 4B and 4C depict the details of the replica multiplexer (RMUX) 360 operation. In an illustrative example, by connecting the inputs of the RMUX 360 to alternating logic (e.g., $D_{in0-r}$ and $D_{in2-r}$ to logic high, $D_{in1-r}$ and $D_{in3-r}$ to logic low), 14-GHz clock waveforms, for example, may generated at the data signals (internal nodes) $D_1$ and $D_2$ of the RMUX 360. If $CK_{0,180}$ is substantially centered with the data signal $D_1$ and $D_2$ transitions, then the RMUX 360 output, data stream ($D_{out-r}$) 370 may be a 28-GHz signal with a duty cycle of substantially 50%. In contrast, the RMUX 360 output may produce a duty cycle on data stream ($D_{out-r}$) 370 of greater than 50% or less than 50% in response to the early or late clock edges on $CK_{0,180}$.

Figure 5:
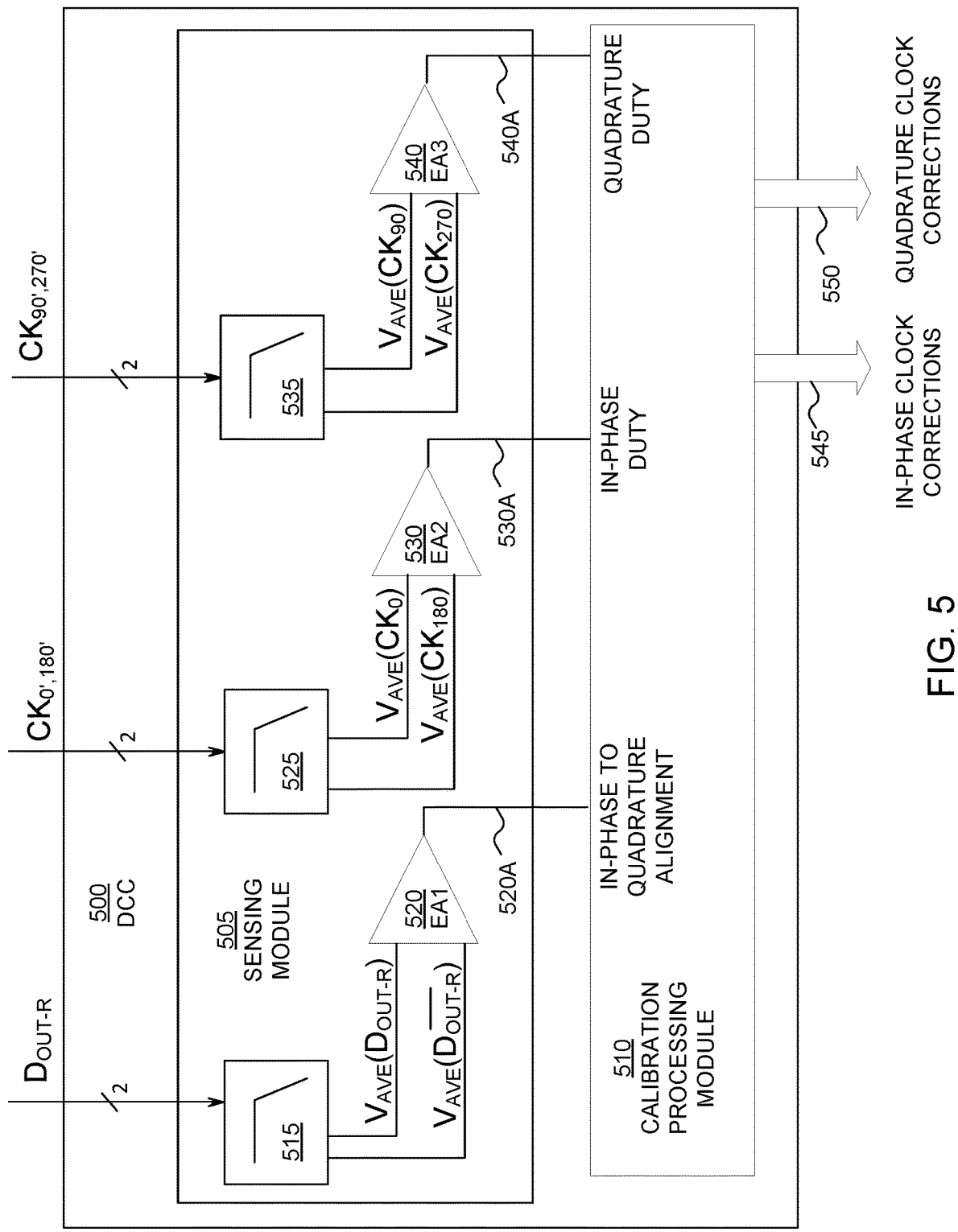
FIG. 5 depicts an exemplary duty cycle calibration module.
Figure 6A:
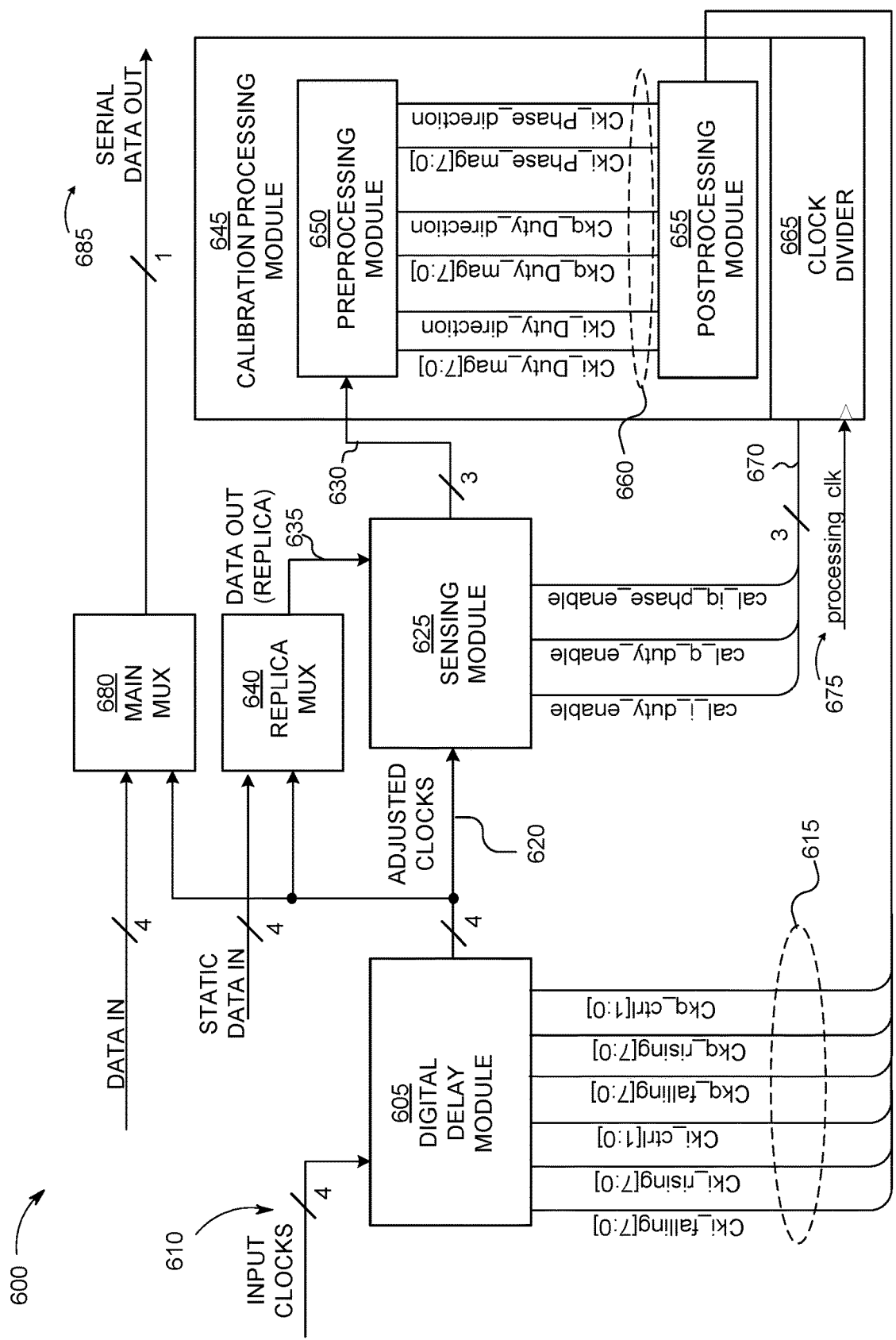
FIGS. 6A and 6B depicts an exemplary clock phase alignment module.
Figure 6B:
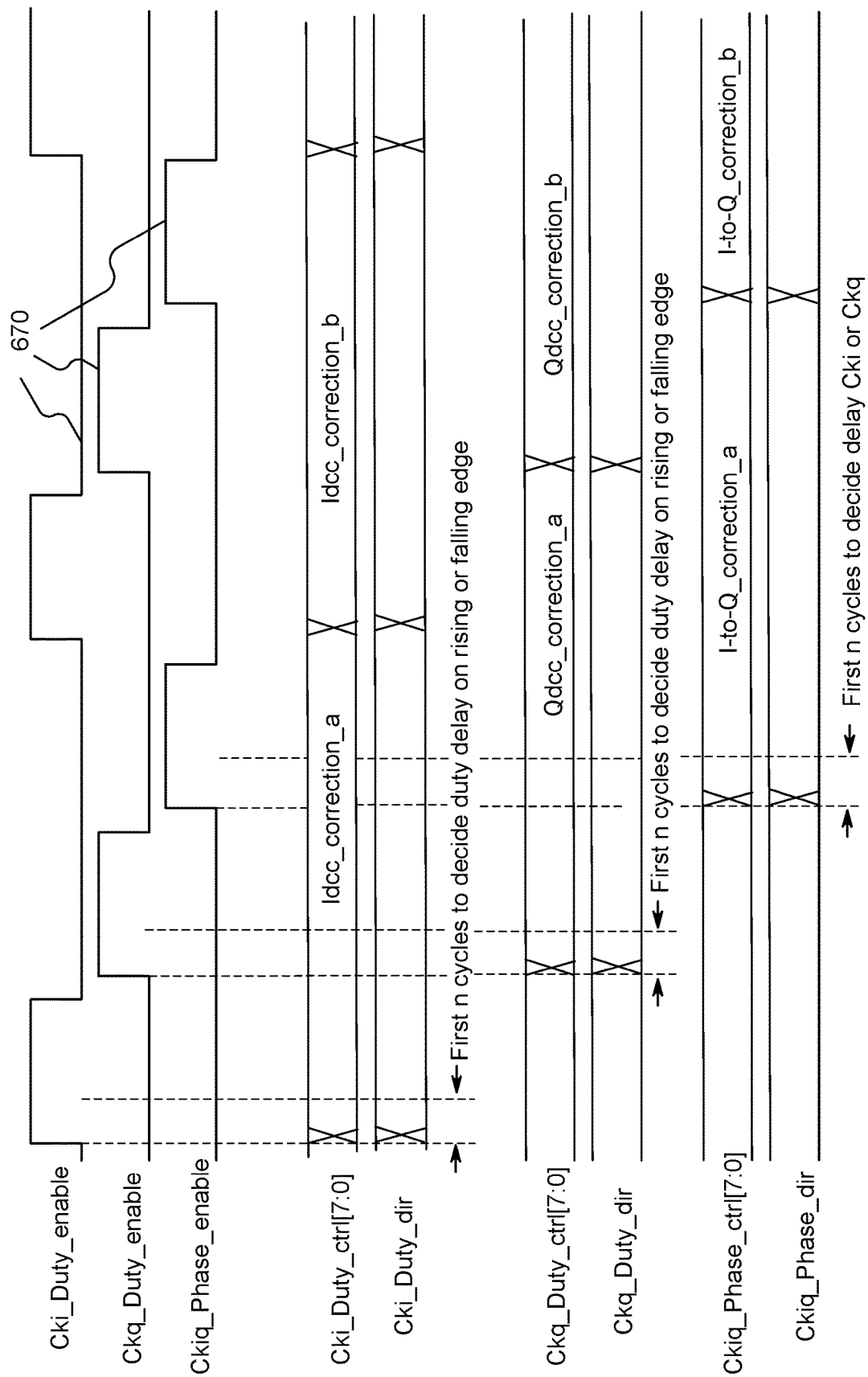

FIG. 5 depicts an exemplary duty cycle calibration module (DCC). A duty cycle calibration module (DCC) 500 includes a sensing module 505 and a calibration processing module 510. In some examples, the DCC 500 may be the DCC 330 (FIG. 3). The sensing module 505 receives one or more differential pairs. In the depicted example, the sensing module 505 receives a $D_{out-r}$ differential pair, a $CK_{0,180}$ differential pair and a $CK_{90,270}$ differential pair.

The $D_{out-r}$ differential pair is generated by the RMUX (FIG. 3, item 360). The $D_{out-r}$ differential pair is filtered by a low-pass filter (LPF) 515. The LPF 515 generates a pair of average voltages $V_{AVE}(D_{out-r})$ and $V_{AVE}(D_{out-r})$ bar. The average voltages are sent to an error amplifier 520, where an error signal 520A is generated indicative of the phase shift of the in-phase clocks ($CK_{0,180}$) with respect to the quadrature clocks ($CK_{90,270}$) alignment.

In an illustrative example, the sensing module 505 may be configured to generate a zero error signal 520A when the in-phase clocks ($CK_{0,180}$) are 90 degrees phase shifted from the quadrature clocks ($CK_{90,270}$). A 90° phase shift may indicate optimal alignment. The sensing module 505 may be configured to generate a positive error signal 520A when the in-phase clocks ($CK_{0,180}$) are less than 90° phase shifted from the quadrature clocks ($CK_{90,270}$), and a negative error signal 520A when the in-phase clocks ($CK_{0,180}$) are more than 90° phase shifted from the quadrature clocks ($CK_{90,270}$). In response to a positive error, for example, the rising and falling edges of $CK_0$ (and the associated rising and falling edges of $CK_{180}$) may be delayed simultaneously to increase the phase shift of the in-phase clocks. Accordingly, in response to a negative error, for example, the rising and falling edges of $CK_{90}$ (and the associated rising and falling edges of $CK_{270}$) may be delayed simultaneously to increase the phase shift of the quadrature clocks. The error signal 520A may include a magnitude indicative of the deviation from 90°.

The $CK_{0,180}$ differential pair is filtered by an LPF 525. The LPF 525 generates a pair of average voltages $V_{AVE}(CK_0)$ and $V_{AVE}(CK_{180})$. The average voltages are sent to an error amplifier 530, where an error signal 530A is generated indicative of the duty cycle of the $CK_{0,180}$ differential pair.

In an illustrative example, the sensing module 505 may be configured to generate a zero error signal 530A when the $CK_{0,180}$ differential pair is at 50% duty cycle. The sensing module 505 may be configured to generate a positive error signal 530A when the duty cycle of the $CK_{0,180}$ differential pair is greater than 50%, and a negative error signal 530A when the duty cycle of the $CK_{0,180}$ differential pair is less than 50%. In response to a positive error, for example, the rising edge of $CK_0$ (and the associated falling edge of $CK_{180}$) may be delayed to decrease the in-phase clock duty cycle. Accordingly, in response to a negative error, for example, the falling edge of $CK_0$ (and the associated rising edge of $CK_{180}$) may be delayed to increase the in-phase clock duty cycle. The error signal 530A may include a magnitude indicative of the deviation from 50% duty cycle.

The $CK_{90,270}$ differential pair is filtered by a LPF 535. The LPF 535 generates a pair of average voltages $V_{AVE}(CK_{90})$ and $V_{AVE}(CK_{270})$. The average voltages are sent to an error amplifier 540, where an error signal 540A is generated indicative of the duty cycle of the $CK_{90,270}$ differential pair.

In an illustrative example, the sensing module 505 may be configured to generate a zero error signal 540A when the $CK_{90,270}$ differential pair is at 50% duty cycle. The sensing module 505 may be configured to generate a positive error signal 540A when the duty cycle of the $CK_{90,270}$ differential pair is greater than 50%, and a negative error signal 540A when the duty cycle of the $CK_{90,270}$ differential pair is less than 50%. In response to a positive error, for example, the rising edge of $CK_{90}$ (and the associated falling edge of $CK_{270}$) may be delayed to decrease the quadrature clock duty cycle. Accordingly, in response to a negative error, for example, the falling edge of $CK_{90}$ (and the associated rising edge of $CK_{270}$) may be delayed to increase the quadrature clock duty cycle. In some examples, the error signal 540A may include a magnitude indicative of the deviation from 50% duty cycle.

The calibration processing module 510 receives the error signals 520A, 530A and 540A. The calibration processing module 510 generates an in-phase clock correction signal 545 and a quadrature clock correction signal 550.

In an illustrative example, the in-phase clock correction signal 545 may include one or more digital control and data buses. The digital control and data buses may include a time delay magnitude, for both rising and falling edges, which may be sent to the delay line module, such as adjustable delay line (ADL1) $315_1$ (FIG. 3), and in this way the duty cycle and the phase of the in-phase clock may be adjusted.

In an illustrative example, the quadrature clock correction signal 550 may include one or more digital control and data buses. The digital control and data buses may include a time delay magnitude, for both rising and falling edges, which may be sent to the delay line module, such as adjustable delay line (ADL2) $315_2$ (FIG. 3), and in this way the duty cycle and the phase of the in-phase clock may be adjusted.

FIGS. 6A and 6B depict a block diagram and associated timing diagram of an exemplary clock phase alignment module. With reference to FIG. 6A, a clock phase alignment module 600 includes a digital delay module 605. The clock phase alignment module 600 may be operable to adjust one or more input clocks 610. The input clocks 610 may include an in-phase differential pair (e.g., $CK_0$, $CK_{180}$) and a quadrature differential pair ($CK_{90}$, $CK_{270}$). The adjustment to the input clocks 610 may be controlled by a delay control signal 615. In the depicted example the delay control signal 615 includes one or more delay module control data buses. The digital delay module 605 may generate a set of adjusted clocks 620 (which may be defined as in-phase adjusted clocks $CK_{0'}$, $CK_{180'}$ and the quadrature adjusted clocks $CK_{90'}$, $CK_{270'}$) by adjusting the delay of a rising and/or a falling edge of the set of input clocks 610 in response to the delay control signal 615. Accordingly, the set of adjusted clocks 620 may reflect the set of input clocks 610 with duty cycle and phase adjustments.

A sensing module 625 receives the adjusted clocks 620 and a data output signal 635 generated by a replica mux 640. The data output signal 635 may represent a phase alignment between the in-phase clocks and the quadrature clocks. The sensing module 625 may generate duty cycle sense signals 630 indicative of the duty cycles of (1) the in-phase adjusted clocks $CK_{0'}$, $CK_{180'}$, (2) the quadrature adjusted clocks $CK_{90'}$, $CK_{270'}$, and (3) the data output signal 635.

A calibration processing module 645 receives the duty cycle sense signals 630 generated by the sensing module 625. The calibration processing module 645 generates the delay control signal 615 based on the duty cycle sense signals 630.

In the depicted example, the calibration processing module 645 includes a preprocessing module 650 and a postprocessing module 655. The preprocessing module 650 generates a set of magnitude and direction signals 660 in response to each of the received duty cycle sense signals 630. The postprocessing module 655 generates the delay control signal 615 in response to the set of magnitude and direction signals 660. The delay control signal 615 may include one or more delay module control data buses. The calibration processing module 645 may generate the delay control signal 615 based on a duty cycle sense signal.

The calibration processing module 645 includes a clock divider 665. The clock divider 665 generates one or more enable signals 670 in response to a processing clock 675. The enable signals 670 may activate the three functions (in-phase clocks duty cycle, quadrature clocks duty cycle, phase duty cycle) within the sensing module 625 in repeating succession.

In various examples, each of three enable signals 670 may activate during one or more processing clocks 675 in a repeating pattern. Further, the enable signals 670 may select one of the sense signals from the sensing module 625 as the output to the duty cycle sense signal 630.

For example, during the first enable signal (cal_i_duty_enable), the duty cycle sense signal 630 may be the resulting LPF sense signal of the in-phase clocks ($CK_{0,180}$). The preprocessing module 650 within the calibration processing module 645 may determine the magnitude and direction signal 660 of the in-phase clock based on the received duty cycle sense signal 630. The postprocessing module 655 within the calibration processing module 645 may receive the magnitude and direction signal 660 and generate a delay magnitude for the in-phase clock edges (e.g., cki_falling[7:0], cki_rising[7:0]). During this first enable signal (cal_i_duty_enable), the calibration processing module 645 may execute this determination eight times, for example, each determination lasting 16 processing clocks.

Next, during the second enable signal (cal_q_duty_enable), the duty cycle sense signal 630 may be the resulting LPF sense signal of the quadrature clock. The preprocessing module 650 within the calibration processing module 645 may determine the magnitude and direction signal 660 of the quadrature clock based on the received duty cycle sense signal 630. The postprocessing module 655 within the calibration processing module 645 may receive the magnitude and direction signal 660 and generate a delay magnitude for the quadrature clock edges (e.g., ckq_falling[7:0], ckq_rising[7:0]). During this second enable signal (cal_q_duty_enable), the calibration processing module 645 may execute this determination eight times, for example, each determination lasting 16 processing clocks.

Finally, during the third enable signal (cal_iq_phase_enable), the duty cycle sense signal 630 may be the resulting LPF sense signal of the data output signal 635 generated by the replica mux 640. The preprocessing module 650 within the calibration processing module 645 may determine the magnitude and direction signals 660 of the data output signal 635 generated by the replica mux 640 based on the received duty cycle sense signal 630. The postprocessing module 655 within the calibration processing module 645 may receive the magnitude and direction signals 660 and generate a common delay magnitude for the in-phase and quadrature clock edges (e.g., cki_falling[7:0], cki_rising[7:0], ckq_falling[7:0], ckq_rising[7:0]). During this third enable signal (cal_iq_phase_enable), the calibration processing module 645 may execute this determination eight times, for example, each determination lasting 16 processing clocks.

The replica mux 640 is a replica of a main mux 680. In various examples, the clock phase alignment module 600 may generate the set of adjusted clocks 620, which may be a corrected copy of the input clocks 610 with adjusted duty cycle and phase. The main mux 680 may produce a serial output data steam 685 with reduced jitter in response to the set of adjusted clocks 620.

With reference to FIG. 6B, a timing diagram of the exemplary clock phase alignment module 600 includes sequential enable signals 670. As described in FIG. 6A, the enable signals activate one of three functions in the duty cycle sensing module 625.

As depicted in the example of FIG. 6B, when the cki_Duty_enable is active (e.g., high), the duty cycle of the in-phase clocks (as denoted by the "i" in the signal name cki_Duty_enable) may be sensed and evaluated in the sensing module 625. The sensing module 625 may generate the duty cycle sense signal 630 with the in-phase clock duty LPF value and send the value to the calibration processing module 645. In various examples, the calibration processing module 645 may allow a number of cycles to elapse (denoted as "n" cycles in FIG. 6B) to allow the in-phase clock duty LPF value to stabilize. The calibration processing module 645 may generate the delay control signal 615 by converting the duty cycle sense signal 630 to a correction value, cki_Duty_cntl[7:0] and cki_Duty_dir.

When the ckq_Duty_enable is active (e.g., high), the duty cycle of the quadrature clocks (as denoted by the "q" in the signal name ckq_Duty_enable) may be sensed and evaluated in the sensing module 625. The sensing module 625 may generate the duty cycle sense signal 630 with the quadrature clock duty LPF value and send the value to the calibration processing module 645. In various examples, the calibration processing module 645 may allow a number of cycles to elapse (denoted as "n" cycles in FIG. 6B) to allow the quadrature clock duty LPF value to stabilize. The calibration processing module 645 may generate the delay control signal 615 by converting the duty cycle sense signal 630 to a correction value, ckq_Duty_cntl[7:0] and ckq_Duty_dir.

When the ckiq_Phase_enable is active (e.g., high), the duty cycle indicative of the in-phase to quadrature phasing, such as the data output signal 635, may be sensed and evaluated in the sensing module 625. The sensing module 625 may generate the duty cycle sense signal 630 with the in-phase to quadrature phasing duty LPF value and send the value to the calibration processing module 645. In various examples, the calibration processing module 645 may allow a number of cycles to elapse (denoted as "n" cycles in FIG. 6B) to allow the in-phase to quadrature phasing duty LPF value to stabilize. The calibration processing module 645 may generate the delay control signal 615 by converting the duty cycle sense signal 630 to a correction value, ckiq_Phase_cntl[7:0] and ckiq_Phase_dir. In some examples, the calibration processing module 645 may generate the delay control signal 615 by converting the duty cycle sense signal 630 to a correction value, ckq_Phase_cntl[7:0] and ckq_Phase_dir. Accordingly, the relative phase of the clocks can be adjusted by delaying the rising and falling edges of the in-phase and/or the quadrature clocks simultaneously.

In various examples, the number of clock cycles for the stabilization time, as denoted by the first "n" samples after the enable signals 670 activation may be different for each function. For example, stabilization for the in-phase clock duty sense may be 5 clocks, the stabilization time for the quadrature clock duty sense may be 10 clocks and the stabilization time for the phase sense duty may be 12 clocks.

The calibration processing module 645 may control the sensing module 625 via the enable signals 670 to indicate which parameter (e.g., in-phase clocks, quadrature clocks, phasing between in-phase and quadrature clocks) is to be sampled and corrected. The calibration processing module 645 may enable the parameters in a sequential repeating fashion as depicted in FIG. 6B. The repeating corrections to the parameters (e.g., in-phase clocks, quadrature clocks, phasing between in-phase and quadrature clocks) may provide real-time compensation of supply and temperature variation.

In some examples, the enables may be activated asymmetrically. For example, the calibration processing module 645 may enable in-phase clock duty cycle sense (ID), the quadrature clock duty cycle sense (QD) then go back to ID, then QD before activating the in-phase to quadrature phasing (IQP). This principle may be expanded further, the calibration processing module 645 producing an enable sequence of ID, QD, ID, QD, ID, QD, before activating IQP, for example. In various implementations, the enables may be activated in a different order, the calibration processing module 645 producing an enable sequence of QD, ID, IQP, for example. In some examples, the calibration processing module 645 may determine an enable sequence that is based on other factors such as the comparative magnitude of the duty cycle error signals, or die temperature, rather than a set pattern, for example.

In an illustrative example, the cki_Duty_dir and ckq_Duty_dir signals may indicate 0 for increase duty cycle and 1 for decrease duty cycle. Further, the ckiq_Phase_dir may indicate 0 for delay the in-phase clock paths and 1 for delay the quadrature clock paths.

Figure 7:
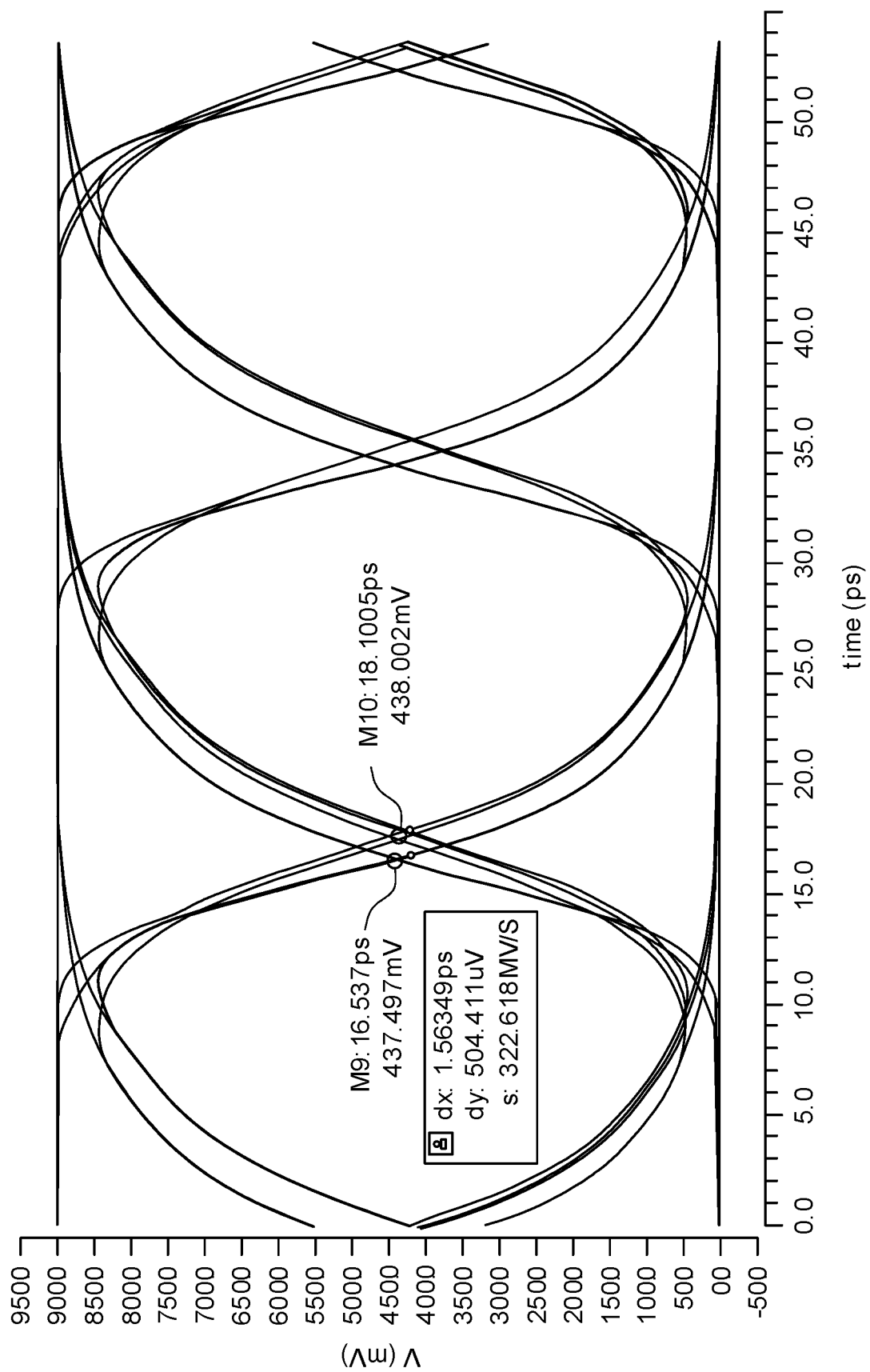
FIG. 7 depicts an exemplary eye-diagram demonstrating clock jitter without the multiplexer clock phase calibration module.

FIG. 7 depicts an exemplary eye-diagram demonstrating clock jitter without the multiplexer clock phase calibration module. In the depicted example, the jitter measurement is 1.563 picoseconds.

Figure 8:
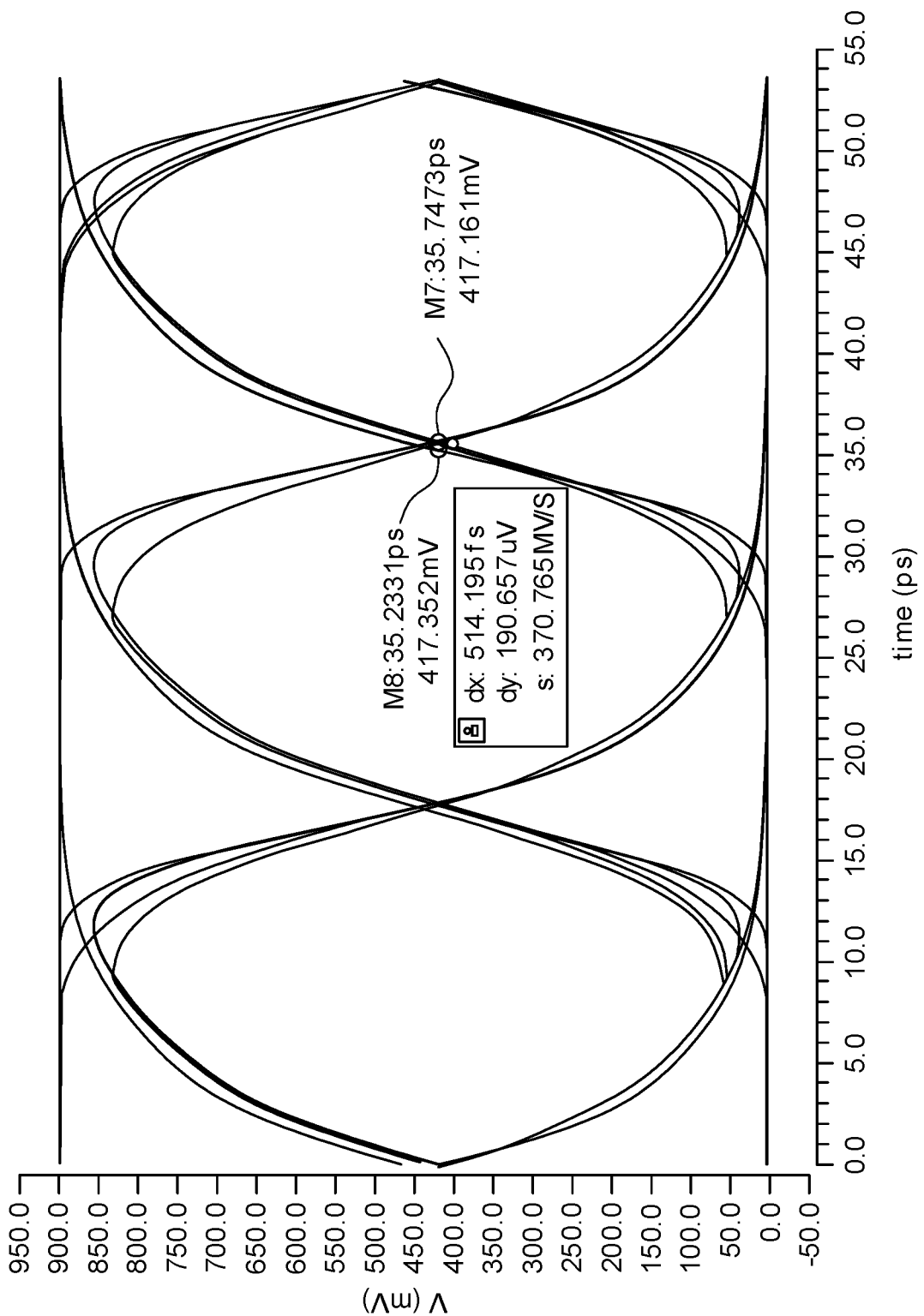
FIG. 8 depicts an exemplary eye-diagram demonstrating clock jitter with the multiplexer clock phase calibration module.

FIG. 8 depicts an exemplary eye-diagram demonstrating clock jitter with the multiplexer clock phase calibration module. In the depicted example, the jitter measurement is 0.514 picoseconds. With reference to FIG. 7 the measurement of FIG. 8 represents a jitter reduction of about 67%.

Figure 9A:
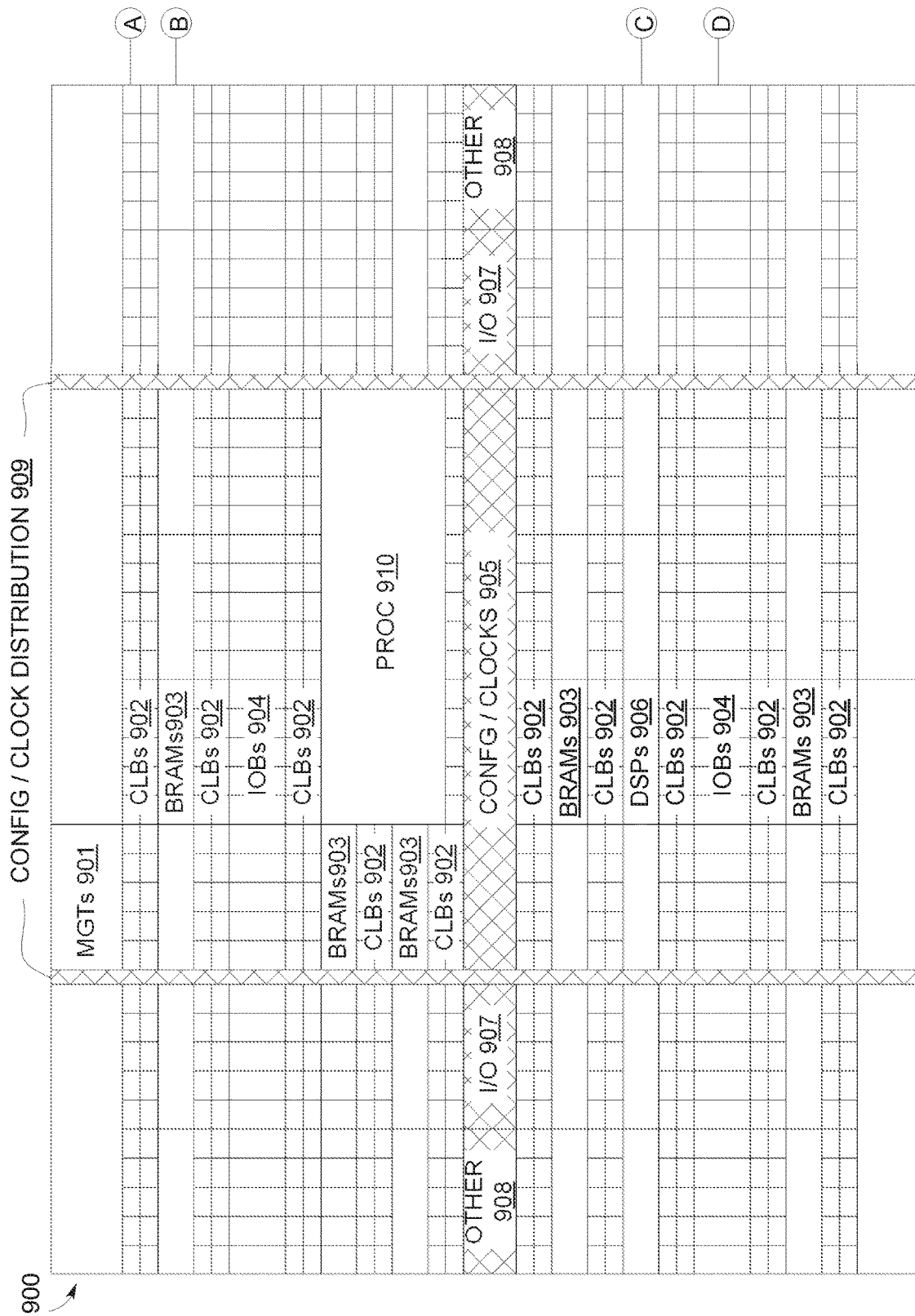
FIGS. 9A and 9B depict an exemplary programmable integrated circuit (IC) on which the disclosed circuits and processes may be implemented.
Figure 9B:
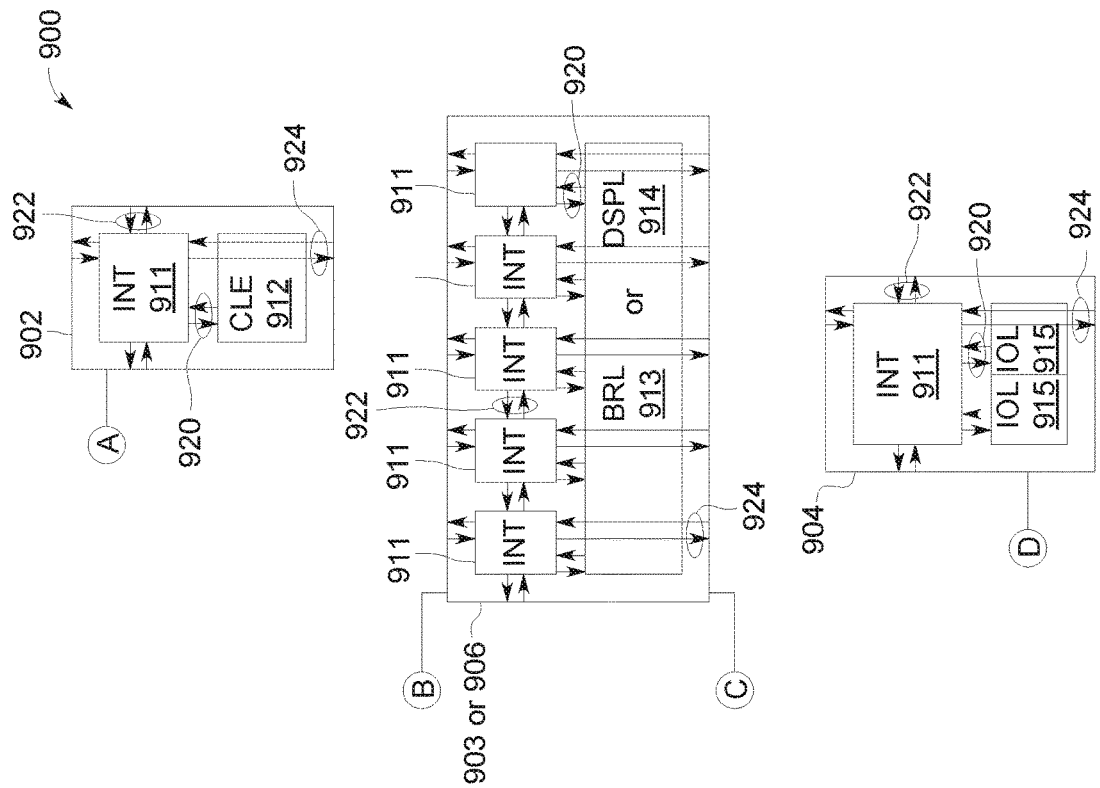

FIGS. 9A and 9B depict an exemplary programmable integrated circuit (IC) on which the disclosed circuits and processes may be implemented. FIGS. 9A and 9B will be described in combination. The connections between FIGS. 9A and 9B are depicted as circle points A, B, C and D. A programmable IC 900 includes field programmable gate array (FPGA) logic. The programmable IC 900 may be implemented with various programmable resources and may be referred to as a System on Chip (SOC). FPGA logic may include several diverse types of programmable logic blocks in the array.

For example, FIG. 9A and FIG. 9B illustrate a programmable IC 900 that includes a large number of different programmable tiles including multi-gigabit transceivers (MGTs) 901, configurable logic blocks (CLBs) 902, blocks of random access memory (BRAMs) 903, input/output blocks (IOBs) 904, configuration and clocking logic (CONFIG/CLOCKS) 905, digital signal processing blocks (DSPs) 906, specialized input/output blocks (I/O) 907 (e.g., clock ports), and other programmable logic 908 (e.g., digital clock managers, analog-to-digital converters, system monitoring logic). The programmable IC 900 includes dedicated processor blocks (PROC) 910. The programmable IC 900 may include internal and external reconfiguration ports (not shown).

In various examples, a serializer/deserializer may be implemented using the MGTs 901. The MGTs 901 may include various data serializers and deserializers. Data serializers may include various multiplexer implementations. Data deserializers may include various demultiplexer implementations.

In some examples of FPGA logic, each programmable tile includes a programmable interconnect element (INT) 911 having standardized inter-connections 924 to and from a corresponding interconnect element in each adjacent tile. Therefore, the programmable interconnect elements taken together implement the programmable interconnect structure for the illustrated FPGA logic. The programmable interconnect element INT 911 includes the intra-connections 920 to and from the programmable logic element within the same tile, as shown by the examples included in FIG. 9B. The programmable interconnect element INT 911 includes the inter-INT-connections 922 to and from the programmable interconnect element INT 911 within the same tile, as shown by the examples included in FIG. 9B.

For example, a CLB 902 may include a configurable logic element (CLE) 912 that may be programmed to implement user logic, plus a single programmable interconnect element INT 911. A BRAM 903 may include a BRAM logic element (BRL) 913 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 906 may include a DSP logic element (DSPL) 914 and one or more programmable interconnect elements. An IOB 904 may include, for example, two instances of an input/output logic element (IOL) 915 and one instance of the programmable interconnect element INT 911. The actual I/O bond pads connected, for example, to the I/O logic element 915, may be manufactured using metal layered above the various illustrated logic blocks, and may not be confined to the area of the input/output logic element 915.

In the pictured implementation, a columnar area near the center of the die (shown shaded in FIG. 9A) is used for configuration, clock, and other control logic. Horizontal areas 909 extending from the column distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 9A and FIG. 9B include additional logic blocks that disrupt the regular columnar structure making up a large part of the programmable IC. The additional logic blocks may be programmable blocks and/or dedicated logic. For example, the processor block PROC 910 shown in FIG. 9A spans several columns of CLBs 902 and BRAMs 903.

Note that FIG. 9A and FIG. 9B are intended to illustrate only an example of programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 902 may be included wherever the CLBs 902 appear, to facilitate the efficient implementation of user logic.

Figure 10:
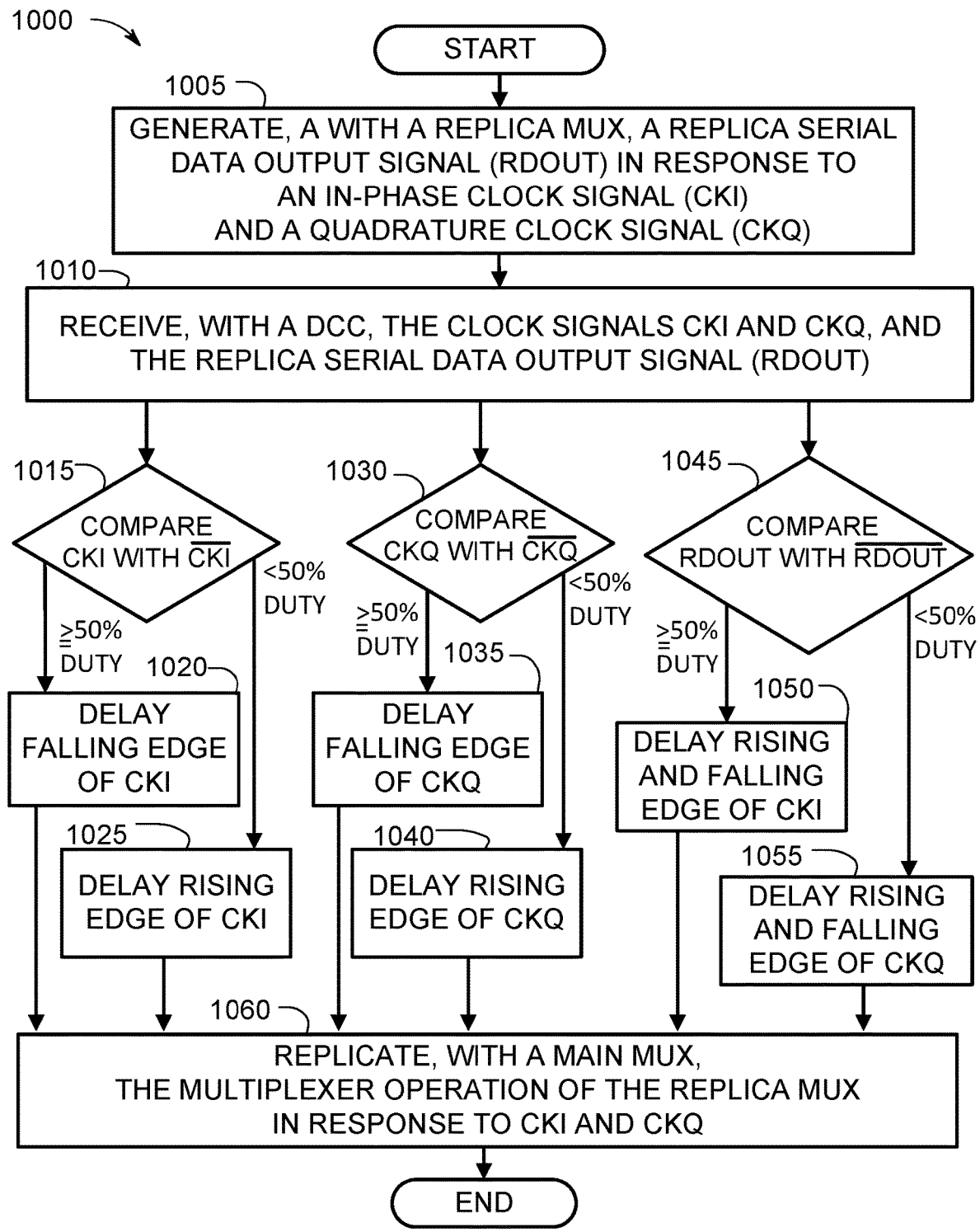
FIG. 10 depicts a flowchart of an exemplary clock phase alignment method.

FIG. 10 depicts a flowchart of an exemplary clock phase alignment method. An exemplary clock phase alignment method 1000 includes block 1005. In block 1005, the clock phase alignment method 1000 generates, with a replica multiplexer (RMUX), a replica serial data output signal (RDOUT) in response to an in-phase clock signal (CKI) and a quadrature clock signal (CKQ). Execution then continues from block 1005, to block 1010. In block 1010, the clock phase alignment method 1000 receives, with a DCC, the clock signals CKI and CKQ. The DCC may also receive the replica serial data output signal (RDOUT). Next, the method 1000 executes one of three decision blocks 1015, 1030 or

1045. The method 1000 may be performed iteratively, and may execute each of the three decision blocks in a queue. In various examples, the method 1000 may execute each of the three decision blocks sequentially and periodically.

The method 1000 may execute decision block 1015. In decision block 1015, the method compares CKI with an inverted CKI. If the result is a signal with greater than or equal to 50% duty, then an adjustable delay line delays a falling edge of CKI at block 1020. If the result is a signal with less than 50% duty, then the adjustable delay line delays a rising edge of CKI at block 1025. Execution then continues to block 1060.

The method 1000 may execute decision block 1030. In decision block 1030, the method compares CKQ with an inverted CKQ. If the result is a signal with greater than or equal to 50% duty, then an adjustable delay line delays a falling edge of CKQ at block 1035. If the result is a signal with less than 50% duty, then the adjustable delay line delays a rising edge of CKQ at block 1040. Execution then continues to block 1060.

The method 1000 may execute decision block 1045. In decision block 1030, the method compares RDOUT with an inverted RDOUT. If the result is a signal with greater than or equal to 50% duty, then an adjustable delay line delays a rising and falling edge of CKI at block 1050. If the result is a signal with less than 50% duty, then the adjustable delay line delays a rising and falling edge of CKQ at block 1055. Execution then continues to block 1060.

At block 1060, the method 1000 replicates, with a main multiplexer (MMUX), the multiplexor operation of the replica multiplexer in response to CKI and CKQ. Execution of the method 1000 may then be complete.

The exemplary clock phase alignment method 1000 may be executed by the calibration processing module 510, with reference to FIG. 5. The calibration processing module 510 may be implemented in hardware or software or a combination thereof.

Although various embodiments have been described with reference to the figures, other embodiments are possible. For example, various embodiments may not be limited to 4 inputs into 1 output. Accordingly, the multiplexer may input 8, 16, 32, 64 or 128 or more bits and generate 1 output. Various embodiments may employ one or more 4-to-1 multiplexers connected in various configurations to implement wider input buses.

Various embodiments may generate a delay control signal by employment of a digital signal processor (DSP). For example, various differential signal pairs may be individually low-pass filtered, the analog results read by the DSP. The DSP may compare the analog results by executing preprogrammed instructions fetched from a memory device. The DSP may provide an analog output signal to a compatible (analog input) delay line to further make adjustments to the duty cycle and/or phase of a set of clocks. In some implementations, the DSP may provide one or more digital output buses to a compatible (digital input) delay line. In various implementations, the DSP may provide the low-pass filtering. Further, in some examples, the DSP may provide the delay line functions.

In various examples, clock timing skew may be reflected on both the MMUX and RMUX as output jitter. The proposed clock calibration techniques may tune/calibrate the $CK_{0,180}$ phase to minimize output jitter. The tuning resolution may be determined by the minimum tunable range of the delay lines. Accordingly, the tuning loop may produce a calibrated clock timing within the resolution of the delay lines.

Various examples of modules may be implemented using circuitry, including various electronic hardware. By way of example and not limitation, the hardware may include transistors, resistors, capacitors, switches, integrated circuits and/or other modules. In various examples, the modules may include analog and/or digital logic, discrete components, traces and/or memory circuits fabricated on a silicon substrate including various integrated circuits (e.g., FPGAs, ASICs). In some embodiments, the module(s) may involve execution of preprogrammed instructions and/or software executed by a processor. For example, various modules may involve both hardware and software.

In an exemplary aspect, a multiplexer-clock calibration module may be adapted to track and compensate a multiplexer-clock input over dynamic operating conditions. The multiplexer-clock calibration module may include a main multiplexer module (MMUX) configured to receive a first array of data signals and may be operative to generate a main serial data output signal (MDout) by selecting one of the data signals in the first array in response to a multiphase MMUX control input. The multiplexer-clock calibration module may include a replica multiplexer module (RMUX) fabricated on a common substrate with the MMUX and configured to replicate the operation of the MMUX. The RMUX may be configured to receive a second array of data inputs and may be operative to generate a replica serial data output signal (RDout). The RMUX may be configured to generate RDout by selecting one of the data inputs in the second array in response to a multiphase RMUX control input. In various examples, the RMUX may be configured to emulate the operational characteristics of the MMUX over process, voltage, and temperature (PVT). RDout and MDout may each be formed as differential signals.

The multiplexer-clock calibration module may include a duty cycle calibration module (DCC) comprising three signal processing circuits. Each of the signal processing circuits may include at least one low pass filter (LPF) coupled to a differential error amplifier. The DCC may be configured to generate a first delay control signal and a second delay control signal to adjust a phase relationship between in-phase clock signals (CKI) and quadrature clock signals (CKQ) in response to RDout.

The multiplexer-clock calibration module may include an adjustable delay line module (ADLM) configured to generate the CKI and the CKQ signals. The ADLM may include a first adjustable delay line module, which may be adapted to delay a system in-phase clock signal (CK0,180) in response to the first delay control signal, to generate the CKI signals. The ADLM may include a second adjustable delay line module adapted to delay a system quadrature clock signal (CK90,270) in response to the second delay control signal, to generate the CKQ signals. The multiphase MMUX control input and the multiphase RMUX control input may be operatively connected to the ADLM to receive both the CKI and CKQ clock signals.

The DCC may be configured to dynamically modulate only the first delay control signal during a first portion of a time interval. The DCC may be configured to dynamically modulate only the second delay control signal during a second portion of the time interval. The DCC may be configured to dynamically modulate the first delay control signal and the second delay control signal during a third portion of the time interval. The first, second and third portions may be non-overlapping.

In some embodiments, each of the first and second adjustable delay line modules may include a voltage-controlled delay line. In various examples, the DCC may be configured to inject an offset voltage into at least one of the first delay control signal and the second delay control signal to adjust at least one of the voltage-controlled delay lines in response to a variance of the duty cycle of RDout with respect to a 50% duty cycle.

The DCC may be configured to repeat the dynamic modulation over a plurality of time intervals. The first adjustable delay line module may include a delay line, which may be adapted to modulate the duty cycle of CKI in response to the first delay control signal, and the second adjustable delay line module may include a delay line, which may be adapted to modulate the duty cycle of CKQ in response to the second delay control signal.

In some implementations, the first and second adjustable delay line modules may be configured to modulate the phase relationship between CKI and CKQ by modulating a timing between a rising edge or a falling edge of CKI relative to a rising edge or a falling edge of CKQ. The duty cycles of CKI and CKQ may be maintained substantially the same while modulating the timing between the rising edge or the falling edge of CKI relative to the rising edge or the falling edge of CKQ. The data inputs in the second array may be configured to form RDout as a substantially 50% duty cycle square wave clock signal at a frequency that is double a frequency of either one of CKI and CKQ.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A multiplexer-clock phase-alignment system for an integrated circuit, the system comprising:
   a) a replica multiplexer (RMUX) configured to receive a replica of input data bus to generate a replica serial data output signal (RDout) in response to a multiphase RMUX control input;
   b) a duty cycle calibration (DCC) processing circuit configured to receive the replica serial data output signal RDout and the multiphase RMUX control input, wherein the DCC processing circuit is further configured to generate a delay control signal in response to sensing duty cycle errors in the multiphase RMUX control input;
   c) an adjustable delay line circuit (ADL) configured to update the multiphase RMUX control input received by the replica multiplexer by selectively delaying component signals of the multiphase RMUX control input in response to the delay control signal; and,
   d) a main multiplexer (MMUX) fabricated on a common substrate with the RMUX and configured to replicate the multiplexer operation of the RMUX in response to the multiphase RMUX control input.

2. The system of claim 1, wherein the multiphase RMUX control input comprises in-phase clock signals (CKI) and quadrature clock signals (CKQ), wherein the CKI signals comprise CK0' and CK180', and the CKQ signals comprise CK90' and CK270'.

3. The system of claim 2, wherein the adjustable delay line circuit (ADL) further comprises:
   a) a first adjustable delay line adapted to delay a system in-phase clock signal (CK0,180) in response to the first delay control signal, to generate the CKI signals; and,
   b) a second adjustable delay line adapted to delay a system quadrature clock signal (CK90,270) in response to the second delay control signal, to generate the CKQ signals.

4. The system of claim 2, wherein the sensed duty cycle errors in the multiphase RMUX control input comprise deviations of the CKQ from a 50% duty cycle.

5. The system of claim 2, wherein the sensed duty cycle errors in the multiphase RMUX control input comprise deviations of the CKI signals from a 50% duty cycle.

6. The system of claim 2, wherein the RMUX is configured to form RDout as a substantially 50% duty cycle square wave clock signal at a frequency that is double a frequency of either one of the CKI signals and CKQ.

7. The system of claim 2, wherein, in response to a variance of the duty cycle of RDout with respect to a 50% duty cycle, the DCC is further configured to inject an offset voltage into at least one of a first delay control signal and a second delay control signal of the delay control signal, wherein the injected offset voltage is operable to adjust at least one of a plurality of voltage-controlled delay lines of the adjustable delay line circuit (ADL).

8. The system of claim 7, wherein the at least one of a plurality of voltage-controlled delay lines of the adjustable delay line circuit (ADL) comprises a first adjustable delay line adapted to modulate the duty cycle of CKI in response to the first delay control signal, and a second adjustable delay line further comprises a delay line adapted to modulate the duty cycle of CKQ in response to the second delay control signal.

9. The system of claim 8, wherein the first and second adjustable delay lines are configured to modulate a phase relationship between the CKI signals and the CKQ signals by modulating a timing between a rising edge or a falling edge of CKI relative to a rising edge or a falling edge of CKQ.

10. The system of claim 2, wherein the duty cycle calibration (DCC) processing circuit is further configured to generate the delay control signal in response to the replica serial data output signal RDout by sensing phase shift error in alignment between the CKI signals and the CKQ signals.

11. The system of claim 1, wherein the duty cycle calibration (DCC) processing circuit further comprises at least one low pass filter adapted to sense duty cycle error in the multiphase RMUX control input.

12. A method to align multiple-phase clocks for a multiplexer on an integrated circuit, the method comprising:
   a) receiving, with a replica multiplexer (RMUX), a replica of input data bus to generate a replica serial data output signal (RDout) in response to a multiphase RMUX control input;
   b) receiving, with a duty cycle calibration (DCC) processing circuit, the replica serial data output signal RDout and the multiphase RMUX control input;
   c) generating, with the duty cycle calibration (DCC) processing circuit, a delay control signal in response to sensing duty cycle errors in the multiphase RMUX control input;
   d) updating, with an adjustable delay line circuit (ADL), the multiphase RMUX control input received by the replica multiplexer by selectively delaying component signals of the multiphase RMUX control input in response to the delay control signal; and,
   e) replicating, with a main multiplexer (MMUX) fabricated on a common substrate with the RMUX, the multiplexer operation of the RMUX in response to the multiphase RMUX control input.

13. The method of claim 12, wherein the multiphase RMUX control input comprises in-phase clock signals (CKI) and quadrature clock signals (CKQ), wherein the CKI signals comprise CK0' and CK180', and the CKQ signals comprise CK90' and CK270'.

14. The method of claim 13, wherein updating, with an adjustable delay line circuit (ADL), the multiphase RMUX control input by selectively delaying component signals of the multiphase RMUX control input in response to the delay control signal further comprises:
 a) delaying, with a first adjustable delay line, a system in-phase clock signal (CK0,180) in response to the first delay control signal, to generate the CKI signals; and,
 b) delaying, with a second adjustable delay line, a system quadrature clock signal (CK90,270) in response to the second delay control signal, to generate the CKQ signals.

15. The method of claim 13, wherein the sensed duty cycle errors in the multiphase RMUX control input comprise deviations of the CKQ from a 50% duty cycle.

16. The method of claim 13, wherein the sensed duty cycle errors in the multiphase RMUX control input comprise deviations of the CKI signals from a 50% duty cycle.

17. The method of claim 13, further comprises injecting, in response to a variance of the duty cycle of RDout with respect to a 50% duty cycle, an offset voltage into at least one of a first delay control signal and a second delay control signal of the delay control signal, wherein the injected offset voltage is operable to adjust at least one of a plurality of voltage-controlled delay lines of the adjustable delay line circuit (ADL).

18. The method of claim 17, wherein the at least one of a plurality of voltage-controlled delay lines of the adjustable delay line circuit (ADL) comprises a first adjustable delay line adapted to modulate the duty cycle of CKI in response to the first delay control signal, and a second adjustable delay line further comprises a delay line adapted to modulate the duty cycle of CKQ in response to the second delay control signal.

19. The method of claim 13, further comprising generating, with the duty cycle calibration (DCC) processing circuit, the delay control signal by sensing phase shift error in an alignment between the CKI signals and the CKQ signals, and by modulating, with the adjustable delay line circuit (ADL), a timing between a rising edge or a falling edge of CKI relative to a rising edge or a falling edge of CKQ to correct the sensed alignment error.

20. The method of claim 12, wherein generating, with the duty cycle calibration (DCC) processing circuit, a delay control signal further comprises sensing, using at least one low pass filter, duty cycle error in the multiphase RMUX control input.

* * * * *